US011546733B2

(12) United States Patent
Cordova et al.

(10) Patent No.: US 11,546,733 B2
(45) Date of Patent: Jan. 3, 2023

(54) SYSTEMS AND METHODS FOR TRANSPORTATION MODE DETERMINATION USING ACCELEROMETER

(71) Applicant: CAMBRIDGE MOBILE TELEMATICS INC., Cambridge, MA (US)

(72) Inventors: Brad Cordova, Cambridge, MA (US); Sushrut Karnik, Somerville, MA (US)

(73) Assignee: CAMBRIDGE MOBILE TELEMATICS INC., Cambridge, MA (US)

( * ) Notice: Subject to any disclaimer, the term of this patent is extended or adjusted under 35 U.S.C. 154(b) by 0 days.

(21) Appl. No.: 17/220,886

(22) Filed: Apr. 1, 2021

(65) Prior Publication Data
US 2021/0352439 A1 Nov. 11, 2021

Related U.S. Application Data

(63) Continuation of application No. 16/542,544, filed on Aug. 16, 2019, now Pat. No. 10,993,080.

(60) Provisional application No. 62/720,689, filed on Aug. 21, 2018.

(51) Int. Cl.
*H04W 4/029* (2018.01)
*H04M 1/02* (2006.01)
*H04W 4/02* (2018.01)

(52) U.S. Cl.
CPC .......... *H04W 4/029* (2018.02); *H04M 1/0202* (2013.01); *H04M 2250/12* (2013.01); *H04W 4/027* (2013.01)

(58) Field of Classification Search
CPC ... H04W 4/029; H04W 4/027; H04M 1/0202; H04M 2250/12; B60W 2556/05; B60W 2556/45; B60W 40/09; B60W 40/12; G08G 1/012; G08G 1/0129; G08G 1/015; G01R 33/02
See application file for complete search history.

(56) References Cited

U.S. PATENT DOCUMENTS

| 2012/0071151 | A1* | 3/2012 | Abramson | H04L 67/12 |
| | | | | 455/418 |
| 2013/0066548 | A1* | 3/2013 | Gruen | G01C 21/3617 |
| | | | | 701/410 |
| 2015/0071102 | A1 | 3/2015 | Sadasivam et al. | |
| 2018/0292471 | A1* | 10/2018 | Chen | G01S 19/26 |

FOREIGN PATENT DOCUMENTS

WO 2014084785 A1 6/2014

OTHER PUBLICATIONS

EP19192645.0, "Office Action", dated Feb. 17, 2022, 4 pages.

* cited by examiner

*Primary Examiner* — Chuong A Ngo
(74) *Attorney, Agent, or Firm* — Kilpatrick Townsend & Stockton LLP

(57) ABSTRACT

A method for determining a transportation mode acquires magnetometer and speed data from a mobile device, correlates the magnetometer to the speed data in groupings, and performs spectral analysis on the groups of magnetometer data. Energy calculated for each of a set of frequency components obtained from the spectral analysis is compared to a baseline value to generate a difference, and a transportation mode type is assigned to the vehicle based on the difference.

20 Claims, 17 Drawing Sheets

400

```
┌─────────────────────────────────────────────┐
│ Operate a magnetometer of a mobile device   │
│ during a trip in a vehicle to acquire       │
│ magnetometer data with respect to one or    │
│ more frequencies                            │
│ 405                                         │
└─────────────────────────────────────────────┘
                      │
                      ▼
┌─────────────────────────────────────────────┐
│ Acquire speed data from the mobile device   │
│ 410                                         │
└─────────────────────────────────────────────┘
                      │
                      ▼
┌─────────────────────────────────────────────┐
│ Correlate the magnetometer data to the      │
│ speed data to separate the magnetometer     │
│ data into one or more groupings             │
│ 415                                         │
└─────────────────────────────────────────────┘
                      │
                      ▼
┌─────────────────────────────────────────────┐
│ Perform spectral analysis on a magnitude of │
│ the magnetometer data for each grouping     │
│ 420                                         │
└─────────────────────────────────────────────┘
                      │
                      ▼
┌─────────────────────────────────────────────┐
│ Calculate an energy for each of the one or  │
│ more frequencies using the spectral analysis│
│ 425                                         │
└─────────────────────────────────────────────┘
                      │
                      ▼
┌─────────────────────────────────────────────┐         ┌──────────┐
│ Compare the energy for each of the one or   │         │ Baseline │
│ more frequencies to a baseline value to     │◄────────│ values   │
│ generate a difference                       │         │ 427      │
│ 430                                         │         └──────────┘
└─────────────────────────────────────────────┘
                      │
                      ▼
┌─────────────────────────────────────────────┐
│ Assign a transportation mode type to the    │
│ vehicle based on the energy difference      │
│ 435                                         │
└─────────────────────────────────────────────┘
```

FIG. 4

SYSTEMS AND METHODS FOR TRANSPORTATION MODE DETERMINATION USING ACCELEROMETER

CROSS-REFERENCE TO RELATED APPLICATIONS

This application is a continuation of U.S. patent application Ser. No. 16/542,544, filed Aug. 16, 2019; which claims the benefit of U.S. Provisional Patent Application No. 62/720,689, filed on Aug. 21, 2018, the contents of which are hereby incorporated by reference in their entirety.

BACKGROUND OF THE INVENTION

Mobile devices, including smart phones, have been utilized to provide location information to users. Mobile devices can use a number of different techniques to produce location data. One example is the use of Global Positioning System (GPS) chipsets, which are now widely available, to produce location information for a mobile device.

In order to use mobile devices to track drivers as they are driving in cars, as well as their driving behaviors, it is helpful to determine the transportation mode of the user of the mobile device as a function of time, for example, whether the person is driving, riding on a bus, riding on a train, riding on a subway, or the like.

Despite the progress made in relation to providing data related to drivers and their vehicles, there is a need in the art for improved methods and systems related to determining modes of transportation that are utilized by users of mobile devices.

SUMMARY OF THE INVENTION

Embodiments of the present disclosure relate to transportation systems. More particularly, embodiments relate to systems and methods for transportation mode determination using sensor measurements from a mobile device.

According to some embodiments, a method is provided. The method may include operating a magnetometer of a mobile device during a trip in a vehicle to acquire magnetometer data with respect to one or more frequencies. The magnetometer may be included in one or more sensors of the mobile device. The method may further include acquiring speed data from the mobile device during the trip in the vehicle. The method may further include correlating the magnetometer data to the speed data to separate the magnetometer data into one or more groupings based on the speed data. The method may further include performing spectral analysis on a magnitude of the magnetometer data for each of the one or more groupings. The method may further include calculating an energy for each of the one or more frequencies using the spectral analysis. The method may further include comparing the energy for each of the one or more frequencies to a baseline value to generate a difference. The method may further include assigning a type to the vehicle based on the difference.

According to some embodiments, a system is provided. The system may include a mobile device comprising a plurality of sensors, a memory, and a processor coupled to the memory. The processor may be configured to perform operations including those recited in the methods described herein.

According to some embodiments, a computer-program product is provided. The computer-program product may be tangibly embodied in a non-transitory machine-readable storage medium of a device. The computer-program product may include instructions that, when executed by one or more processors, cause the one or more processors to perform operations including the steps of the methods described herein.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

Numerous benefits are achieved by way of the various embodiments over conventional techniques. For example, the various embodiments provide methods and systems for determining a transportation mode utilized by a user of a mobile device. In some embodiments, information acquired by sensors of the mobile device may be analyzed by a processor of the mobile device to determine whether the user is likely to be a driver of a vehicle. If so, the sampling rate of the sensors may be increased to enable determination of driving characteristics. These and other embodiments along with many of its advantages and features are described in more detail in conjunction with the text below and attached figures.

The foregoing, together with other features and embodiments, will become more apparent upon referring to the following specification, claims, and accompanying drawings.

BRIEF DESCRIPTION OF THE DRAWINGS

Illustrative embodiments of the present disclosure are described in detail below with reference to the following drawing figures:

FIG. 4 is a flowchart illustrating a transportation mode determination method according to some embodiments.

DETAILED DESCRIPTION OF SPECIFIC EMBODIMENTS

Figure 1:
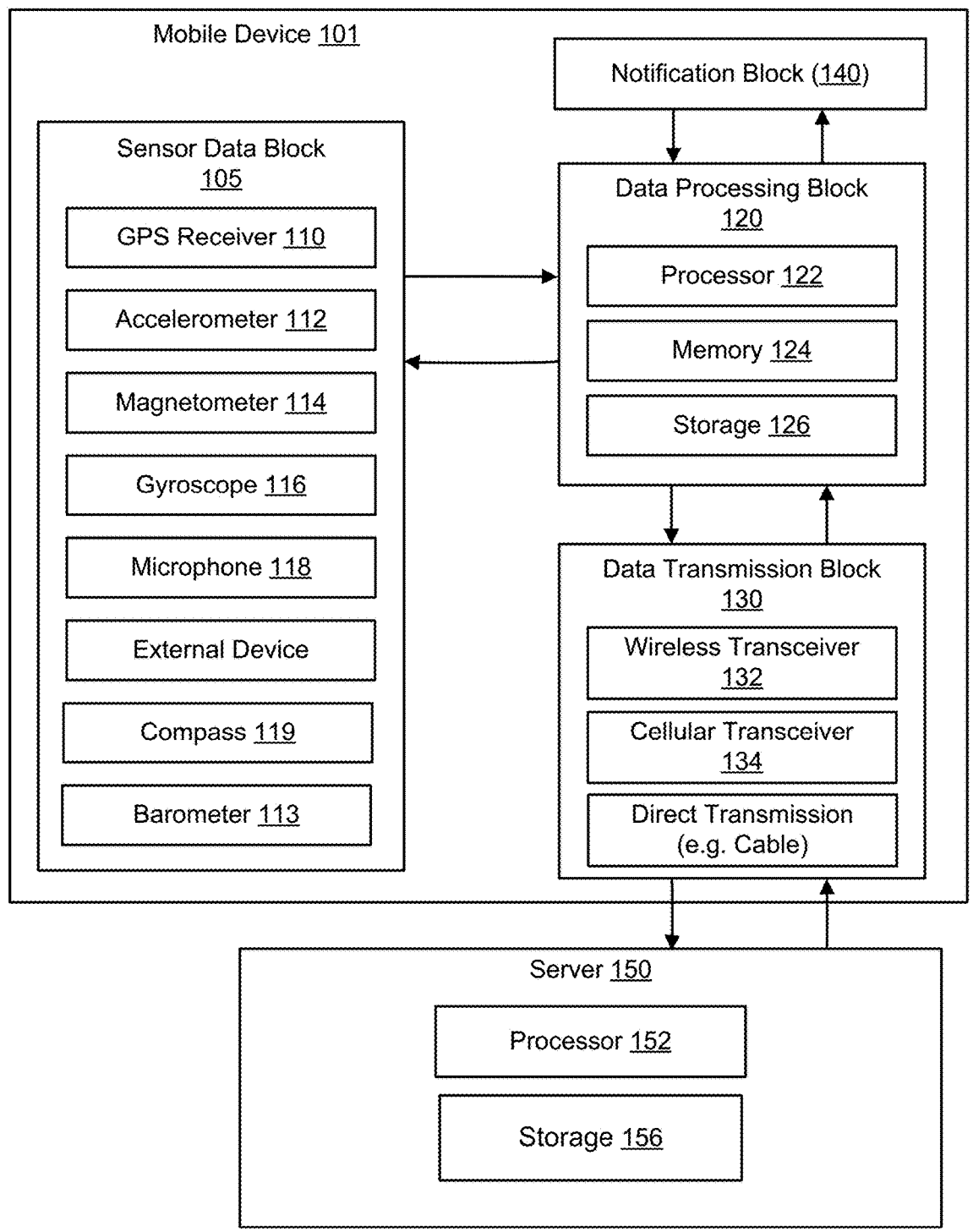
FIG. 1 is a system diagram illustrating a transportation mode determination system including a mobile device according to some embodiments.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the invention. However, it will be apparent that various embodiments may be practiced without these specific details. The figures and description are not intended to be restrictive.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

Some embodiments described herein use approaches to collecting and analyzing driving data similar to the approaches described in U.S. Pat. No. 10,067,157, issued Sep. 4, 2018, entitled "METHODS AND SYSTEMS FOR SENSOR-BASED VEHICLE ACCELERATION DETERMINATION" ("the '157 patent"), U.S. Pat. No. 9,892,363, issued Feb. 13, 2018, entitled "METHODS AND SYSTEMS FOR SENSOR-BASED DRIVING DATA COLLECTION" ("the '363 patent"), U.S. Pat. No. 10,231,093, issued Mar. 12, 2019, entitled "METHODS AND SYSTEMS FOR DRIVER IDENTIFICATION" ("the '093 patent"), U.S. Pat. No. 10,054,446, issued Aug. 21, 2018, entitled "METHODS AND SYSTEMS FOR COMBINING SENSOR DATA TO MEASURE VEHICLE MOVEMENT" ("the '446 patent"), the contents of which patents and applications are incorporated by reference herein in their entireties for all purposes.

FIG. 1 is a system diagram illustrating a system 100 for detecting and scoring driving data according to some embodiments. System 100 includes a mobile device 101 having a number of different components. The mobile device 101 may include a sensor data block 105, a data processing block 120, a data transmission block 130, and optionally a notification block 140. The sensor data block 105 includes data collection sensors as well as data collected from these sensors that are available to mobile device 101. This can include external devices connected via Bluetooth, USB cable, etc.

The data processing block 120 may include a processor 122, a memory 124, and a storage 126. The processor 122 may be a microprocessor, a microcontroller, of other programmable device. The memory 124 may be configured to store instructions executed by the processor and data operated on by the processor. Results of manipulations performed on the data obtained from the sensor data block 105 by processor 122 may be stored in the storage 126. The manipulations may include, but are not limited to, analyzing, characterizing, subsampling, filtering, reformatting, etc.

The data transmission block 130 may include a wireless transceiver 132, a cellular transceiver 134, and direct transmission capability, for example, using a cable. The data transmission block 130 may provide transmission of the data from the mobile device 101 to an external device and vice versa. In some implementations, the external device may be a computing device. The external device may be configured to store and manipulate the data obtained from sensor data block 105. The external computing device can be, for example, a server 150. Server 150 can comprise its own processor 152 and storage 156.

The notification block 140 may report the results of analysis of sensor data performed by the data processing block 120 to a user of the mobile device 101 via a display (not shown). For example, the notification block 140 may display or otherwise report a transportation mode determination for a trip to a user of the mobile device 101. The transportation mode determination may be performed by the processor 122 of mobile device 101 in some embodiments. In some embodiments, the transportation mode determination may be performed by the server 150, as described further herein with respect to FIG. 2.

Some embodiments are described using examples where driving data is collected using mobile devices 101, and these examples are not limited to any particular mobile device. As examples, a variety of mobile devices including sensors such as accelerometers 112, magnetometers 114, gyroscopes 116, compasses 119, barometers 113, location determination systems such as global positioning system (GPS) receivers 110, communications capabilities, and the like are included within the scope of the present disclosure. Exemplary mobile devices include smart watches, fitness monitors, Bluetooth headsets, tablets, laptop computers, smart phones, music players, movement analysis devices, and other suitable devices. Given the description herein, many variations, modifications, and alternatives for the implementation of embodiments can be recognized.

To collect data associated with the driving behavior of a driver, one or more sensors on mobile device 101 (e.g., the sensors of the sensor data block 105) are operated close in time to a period when mobile device 101 is with the driver when operating a vehicle—also termed herein "a drive" or "a trip." With many mobile devices 101, the sensors used to collect data are components of the mobile device 101, and use power resources available to the mobile device 101 components, e.g., mobile device battery power and/or a data source external to the mobile device 101. Data may be similarly collected and analyzed to determine if a trip is made on other transportation modes.

Some embodiments use settings of a mobile device to enable different functions described herein. For example, in Apple iOS, and/or Android OS, having certain settings enabled can enable certain functions of embodiments. For some embodiments, having location services enabled allows the collection of location information from the mobile device (e.g., collected by global positioning system (GPS) sensors, and enabling background app refresh allows some embodiments to execute in the background, collecting and analyzing driving data even when the application is not executing. In some implementations, alerts are provided or surfaced using notification block 140 while the application is running in the background since the trip capture can be performed in the background.

Figure 2:
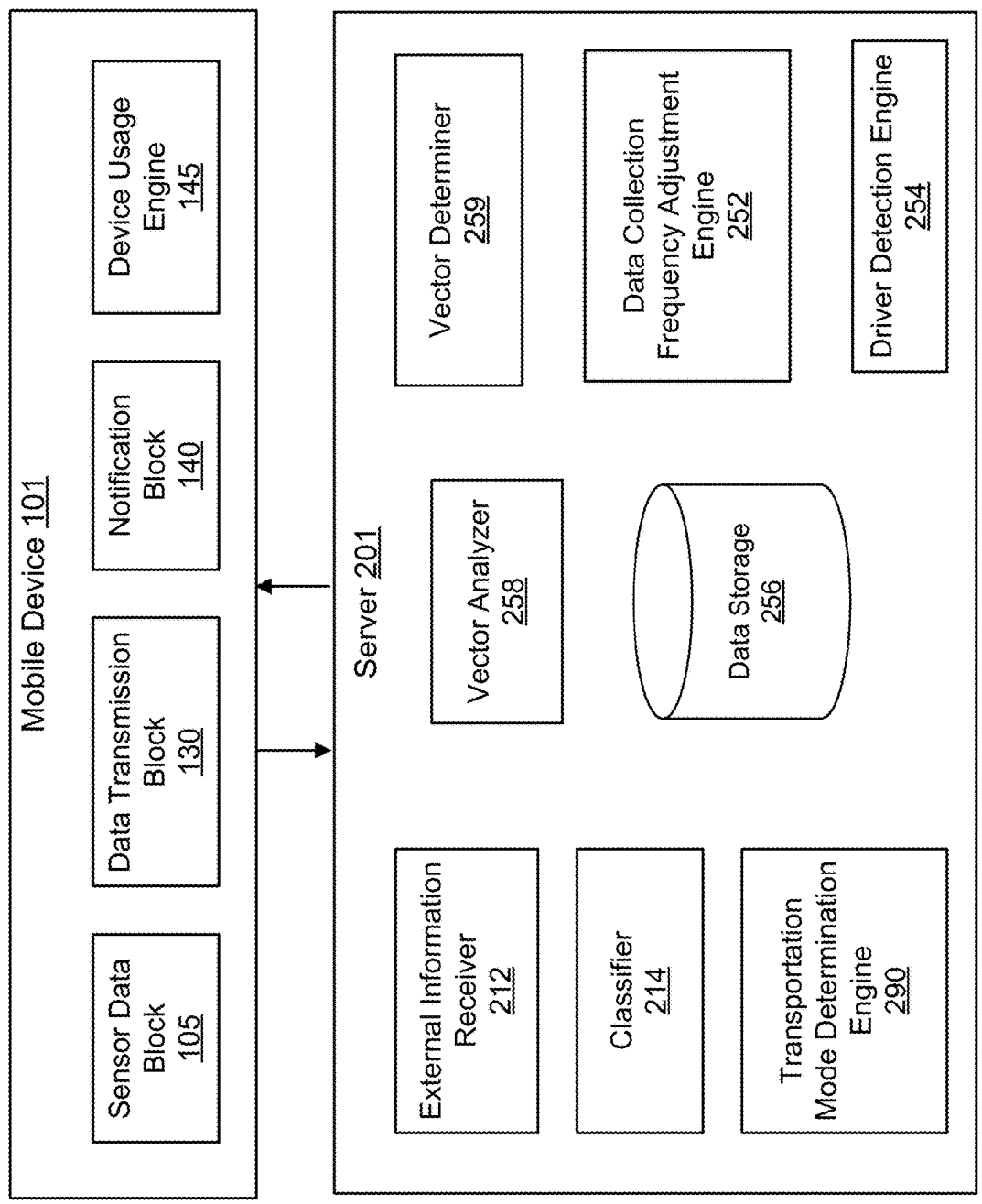
FIG. 2 is a system diagram illustrating a transportation mode determination system including a server according to some embodiments.

FIG. 2 shows a system 200 for collecting driving data that can include a server 201 that communicates with the mobile device 101. The server 201 may be the same or a different server than the server 150 of FIG. 1. In some embodiments, the server 201 may provide functionality using components including, but not limited to a vector analyzer 258, a vector determiner 259, an external information receiver 212, a classifier 214, a data collection frequency adjustment engine 252, a driver detection engine 254, and a transportation mode determination engine 290. These components may be executed by processors (not shown) in conjunction with memory (not shown). The server 201 may also include a data storage 256. It is important to note that, while not shown, one or more of the components shown operating within the server 201 can operate fully or partially within the mobile device 101, and vice versa.

To collect data associated with the driving behavior of a driver (or the transportation mode of a passenger), one or more sensors on the mobile device 101 (e.g., the sensors of sensor data block 105) may be operated close in time to a period when the mobile device 101 is with the user in a vehicle—also termed herein "a drive" or "a trip". Once the mobile device sensors have collected data (and/or in real time), some embodiments analyze the data to determine acceleration vectors for the vehicle, as well as different features of the trip. For example, the driver detection engine 254 may apply one or more processes to the data to determine whether the user of the mobile device 101 is a driver of the vehicle. Other examples are processes to detect and classify driving features using the classifier 214, and determine acceleration vectors using the vector analyzer 258 and the vector determiner 259. In some embodiments, external data (e.g., weather) can be retrieved and correlated with collected driving data.

As discussed herein, some embodiments can transform collected sensor data (e.g., driving data collected using the sensor data block 105) into different results, including, but not limited to, analysis and determination of a transportation mode using the transportation mode determination engine 290. Examples of collecting driving data using sensors of a mobile device are described herein. Examples of analyzing collected driving data to detect a transportation mode are also described herein. Notifications of transportation mode, such as display of a finding of "bus," "car," "train," "plane," etc., can be made via the notification block 140 of the mobile device 101. The transportation mode may be used to adjust the frequency of data collected by the sensor data block 105 in some embodiments, as adjusted by the data collection frequency adjustment engine 252. The data collection frequency adjustment engine 252 may be in communication with the mobile device 101 to cause the sensor data block 105 to collect data more frequently, less frequently, or at the same frequency, as described further herein with respect to the following figures.

Although shown and described as being contained within the server 201, which can be remote from the mobile device 101, it is contemplated that any or all of the components of the server 201 may instead be implemented within the mobile device 101, and vice versa. It is further contemplated that any or all of the functionalities described herein may be performed during a drive, in real time, or after a trip.

Figure 3:
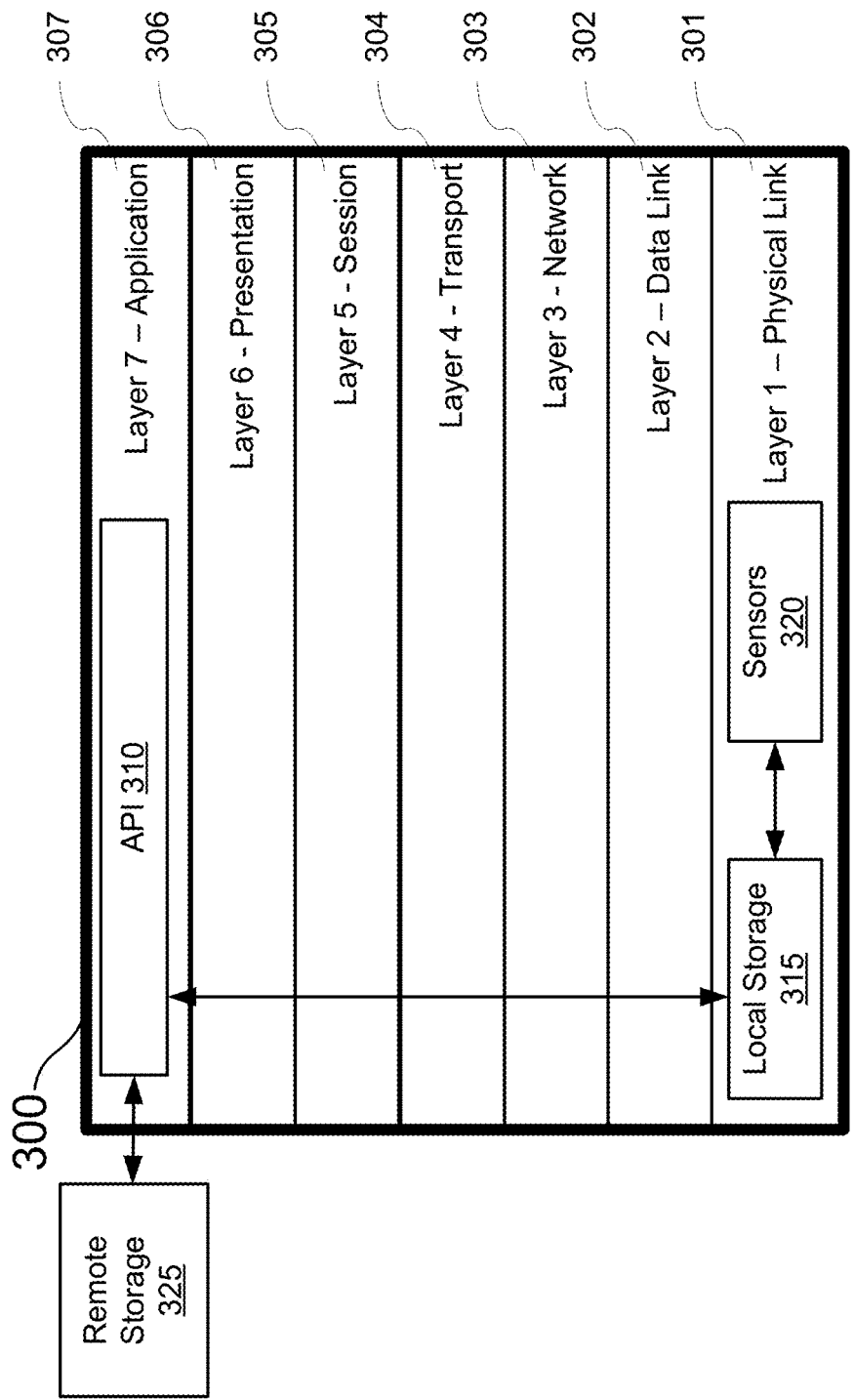
FIG. 3 is an is an architectural diagram illustrating the functional layers of a mobile device according to some embodiments.

FIG. 3 is a block diagram of a protocol stack 300 that may be implemented by the mobile device 101 in accordance with some embodiments. The mobile device 101 may implement the protocol stack to communicate with any of the other systems described herein, such as the server 150 and/or the server 201. The protocol stack 300 may include one or more of seven layers: an application layer 307, a presentation layer 306, a session layer 305, a transport layer 304, a network layer 303, a data link layer 302, and a physical link layer 301. Together, these seven layers may represent a model, such as an Open Systems Interconnection (OSI) model. The OSI model of FIG. 3 may characterize the communication functions of the described systems. Although shown and described as having seven layers, it is contemplated that the protocol stack 300 may include more or fewer layers to perform less, the same, or additional functions.

According to the OSI model, the application layer 307 may interact with a user (e.g., via receiving user inputs and presenting outputs) and software applications implementing a communication component. The application layer 307 may synchronize communication between systems and determine resource availability. The application layer 307 may be application-specific, in that the specific functions dependent on the particular application being executed by the mobile device 101.

For example, the application layer 307 may execute an application programming interface (API) 310 which in turn may execute the processes (e.g., the method 400 illustrated in FIG. 4) of the disclosure. API 610 may be executed entirely at the application layer 307. API 310 may be in communication with remote storage 325, such as the storage 156 of the server 150. In some embodiments, data collected by the sensors 320 may be stored in the remote storage 325.

The presentation layer 306 may translate between application and network formats. Various applications and networks may implement different syntaxes and semantics. Thus, the presentation layer 306 may transform data from the network into a form that the application accepts. The presentation layer 306 may also format and encrypt data from the application to be sent on a network.

The session layer 305 may control connections between the systems and other devices and/or servers, as described herein. The session layer 305 may establish the connections, manage the connections, and terminate the connections used to communicate between the devices.

The transport layer 304 may provide techniques for performing quality of service functions during transfers of data between devices. The transport layer 304 may provide error control. For example, the transport layer 304 may keep track of data being transmitted and may retransmit any communications that fail. In addition, the transport layer 304 may provide an acknowledgment of successful data transmission and send the next data to be transmitted in a synchronous fashion if no errors occurred.

The network layer 303 may provide the means of transferring the data to and from the systems over a network. The source node and destination node of the systems may each have an address which permits the other to transfer data to it by providing the address with the data. The network layer 303 may also perform routing functions that allow it to a determine a path between the source node and destination node, possibly through other nodes.

The data link layer 302 may define and provide the link between a directly and physically connected source node and destination node. The data link layer 302 may further detect and correct errors occurring at the physical link layer 301. In some embodiments, the data link layer 302 may include two sublayers: a media access control (MAC) layer that may control how devices in the network gain access to data and gain permission to transmit the data, and a logical link control (LLC) layer that may identify network layer 303 protocols and encapsulate them.

The physical link layer 301 may include one or more sensors 320. The sensors 320 may include, for example, an accelerometer, a compass, a gyroscope, a magnetometer, a GPS, and/or the like. The physical link layer 301 may further include one or more input devices (not shown), such as a keyboard, a mouse, a trackpad, a trackball, a touchscreen display, and/or any other device capable of receiving user input. The physical link layer 301 may further include local storage 315. In some embodiments, data collected by the sensors 320 may be stored in local storage 315. The physical link layer 301 may define the electrical and physical specifications of the data. The physical link layer 301 may provide a physical medium for storing unstructured raw data to be transmitted and received.

FIG. 4 is a flowchart illustrating a transportation mode determination method 400 according to some embodiments. At block 405, magnetometer data may be acquired. A magnetometer of a mobile device may be operated during a trip in a vehicle to acquire magnetometer data with respect to one or more frequencies. The magnetometer may be, for example, the magnetometer 114 of FIG. 1. The mobile device may be, for example, the mobile device 101 of FIG. 1 and/or FIG. 2. The magnetometer may be included in one or more sensors of the mobile device. In some embodiments, the magnetometer data may be collected at a high frequency, such as 50 Hz or another data collection frequency.

At block 410, vehicle speed data may be acquired from the mobile device. The vehicle speed data may be acquired using a sensor of the one or more sensors of the mobile device. The vehicle speed data may be acquired, for example, from a GPS receiver (such as the GPS receiver 110 of FIG. 1), from an accelerometer (such as the accelerometer 112 of FIG. 1), and/or the like.

At block 415, the magnetometer data may be correlated to the vehicle speed data to separate the magnetometer data into one or more groupings. For example, the processor of the mobile device may cause the magnetometer data to be separated into groupings based on the vehicle speed data acquired by the one or more sensors of the mobile device at the time the magnetometer data was acquired. The groupings of the magnetometer data may be formed based on ranges of vehicle speed, for example, magnetometer data acquired during a vehicle speed range of 25-35 mph, magnetometer data acquired during a vehicle speed range of 35-45 mph, magnetometer data acquired during a vehicle speed range of 45-55 mph, magnetometer data acquired during a vehicle speed range of 55-65 mph, magnetometer data acquired during a vehicle speed range of 65-75 mph, etc.).

At block 420, spectral analysis may be performed on a magnitude of the magnetometer data for each grouping. The processor of the mobile device may cause spectral analysis to be performed on the magnetometer data. Spectral analysis may analyze the magnetometer data with respect to frequency for each of the speed groupings. Once spectral analysis is performed, at block 425, an energy may be calculated for each of the one or more frequencies using the spectral analysis. For example, the processor of the mobile device may cause the energy for each frequency component of the magnetometer data to be calculated.

At block 430, the energy for each of the one or more frequency components may be compared to a baseline value 427 to generate an energy difference. The baseline value 427 may be the energy at each frequency component associated with different modes of transportation. For example, a train may have a certain energy at a certain frequency component, a bus may have a different energy at the certain frequency component, a car may have still another energy at the certain frequency component, and so forth. The processor of the mobile device may cause the energy at each frequency component as calculated to be compared to the energies of the different transportation modes at the same frequency component as the measurement.

At block 435, a transportation mode type may be assigned to the vehicle based on the difference. The transportation mode associated with the smallest difference in energy at a majority or a threshold number of frequencies may be assigned. The processor of the mobile device may determine the difference between the measured energy values and the baseline values for the different transportation modes at corresponding frequency components. The processor may determine the transportation mode having the smallest difference in energy from the measured values at a specified number of frequency components as the transportation mode type to be assigned.

As discussed further herein, the type of vehicle may be, for example, a car, a train, a bus, a ferry, a subway, an airplane, and/or the like. If the type of vehicle is a car, the method may, in some embodiments, further include operating the one or more sensors of the mobile device at a first frequency before assigning the type to the vehicle, and operating the one or more sensors at a second frequency higher than the first frequency after assigning the type to the vehicle. In other words, data may be collected from the one or more sensors more frequently if it is determined that the mobile device is in a car in order to perform further analysis. Further analysis of the sensor data may include driver identification, driving behavior analysis, mobile device usage analysis, etc.

If the type of vehicle is other than a car, the method may, in some embodiments, further include operating the one or more sensors of the mobile device at a first frequency before assigning the type to the vehicle, and operating the one or more sensors at a second frequency lower than the first frequency after assigning the type to the vehicle. In some embodiments, the method may further include operating the one or more sensors of the mobile device at a first frequency before assigning the type to the vehicle, and disabling the one or more sensors after assigning the type to the vehicle. The one or more sensors may be disabled or operated at a lower frequency if the type of the vehicle is not a car, since the sensor data may not be relevant to the driving behavior of the user of the mobile device.

In some embodiments, the sensors may continue to operate at a reduced frequency and/or be disabled until a change of speed is detected by a sensor of the mobile device. For example, if a vehicle is identified as a train traveling at a speed of 70 mph and a speed of 0 mph is detected followed by a speed of 45 mph, the sensors may begin to operate more frequently in order to make a new transportation mode determination. In other words, the process may restart at block 405.

While the operations at blocks 415-435 of the above method 400 are explained using the processor of the mobile device (e.g., the processor 122), it should be understood that the operations at blocks 415-435 can also be performed at a server (e.g., the server 201). Alternatively, the operations at blocks 415-435 may be performed by a combination of the processor of the mobile device and the server.

It should be appreciated that the specific steps illustrated in FIG. 4 provide a particular method for transportation mode determination according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

The method 400 may be embodied on a non-transitory computer readable medium, for example, but not limited to, the memory 124 or other non-transitory computer readable medium known to those of skill in the art, having stored therein a program including computer executable instructions for making a processor, computer, or other programmable device execute the operations of the methods.

Figure 5:
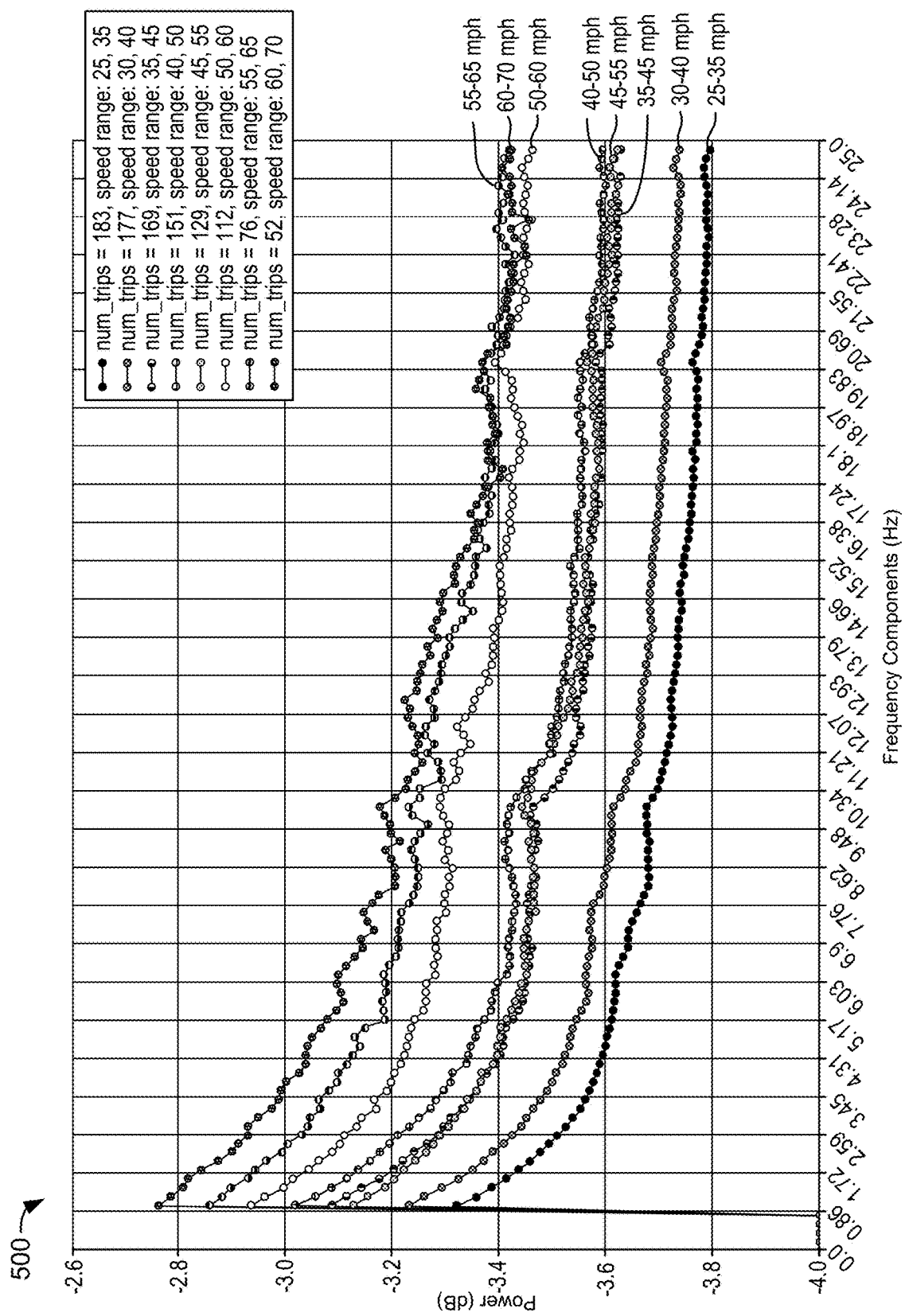
FIG. 5 is a plot of power versus frequency components at various speeds of a car as measured by a magnetometer of a mobile device according to some embodiments.
Figure 6:
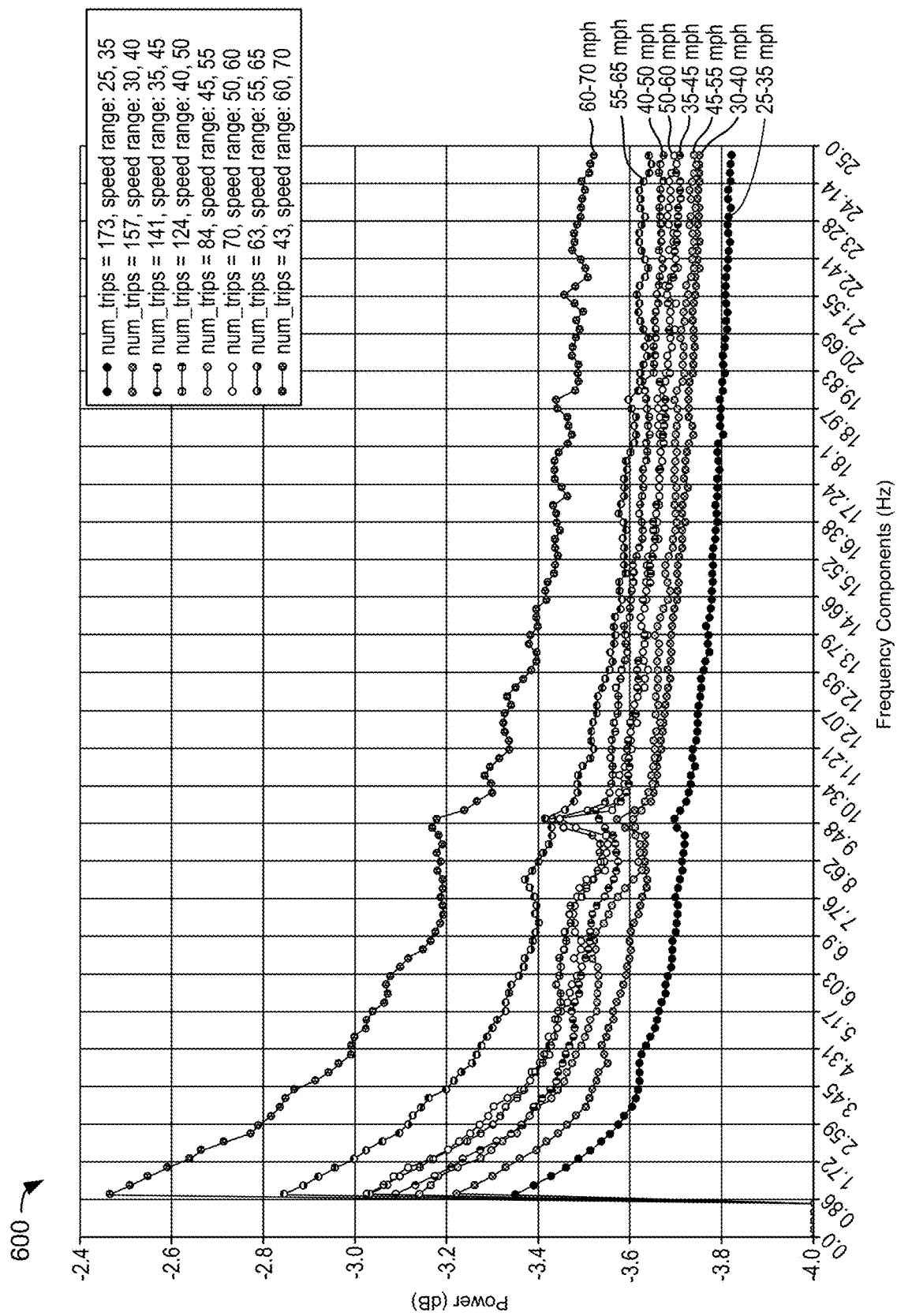
FIG. 6 is a plot of power versus frequency components at various speeds of a bus as measured by a magnetometer of a mobile device according to some embodiments.
Figure 7:
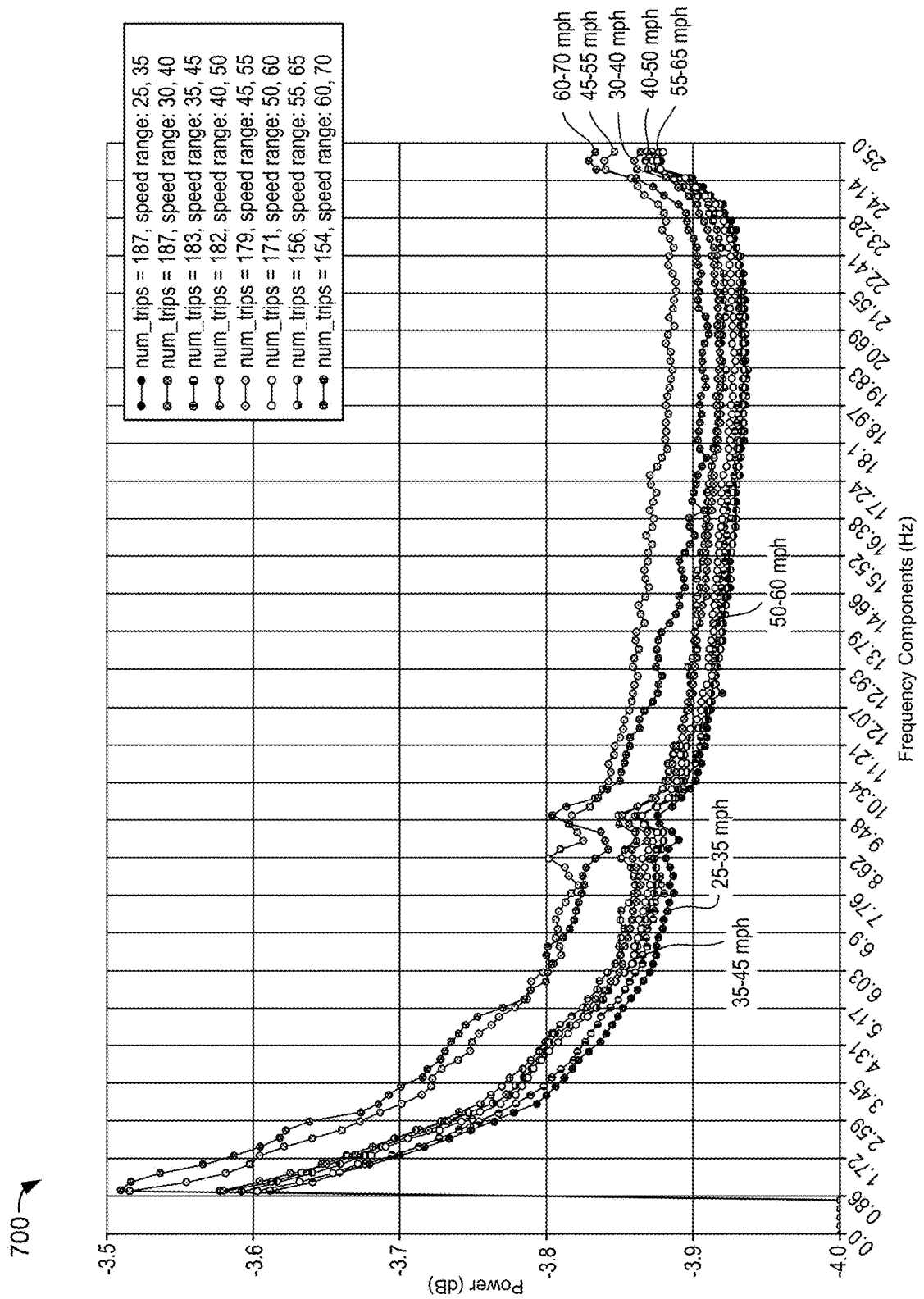
FIG. 7 is a plot of power versus frequency components at various speeds of a train as measured by a magnetometer of a mobile device according to some embodiments.

FIG. 5 is a plot 500 of power versus frequency at various speeds of a car as measured by a magnetometer of a mobile device according to some embodiments. FIG. 6 is a plot 600 of power versus frequency at various speeds of a bus as measured by a magnetometer of a mobile device according to some embodiments. FIG. 7 is a plot 700 of power versus frequency at various speeds of a train 700 as measured by a magnetometer of a mobile device according to some embodiments. In FIGS. 5-7, the x-axis represents the Fourier transformed frequency components of the magnetometer signal sampled at 50 Hz. This data may be used for baseline values 327, according to some embodiments.

As can be seen in FIGS. 5-7, the power at similar frequency components for a car, a bus, and a train may be highly variable across the different modes of transportation. Thus, by comparing a magnetometer reading at a given frequency component and speed to the powers for that frequency component and speed in FIGS. 5-7, a difference between the reading and the baseline values may be generated. The transportation mode associated with the lowest difference may be assigned as the type of vehicle associated with the trip.

Figure 8A:
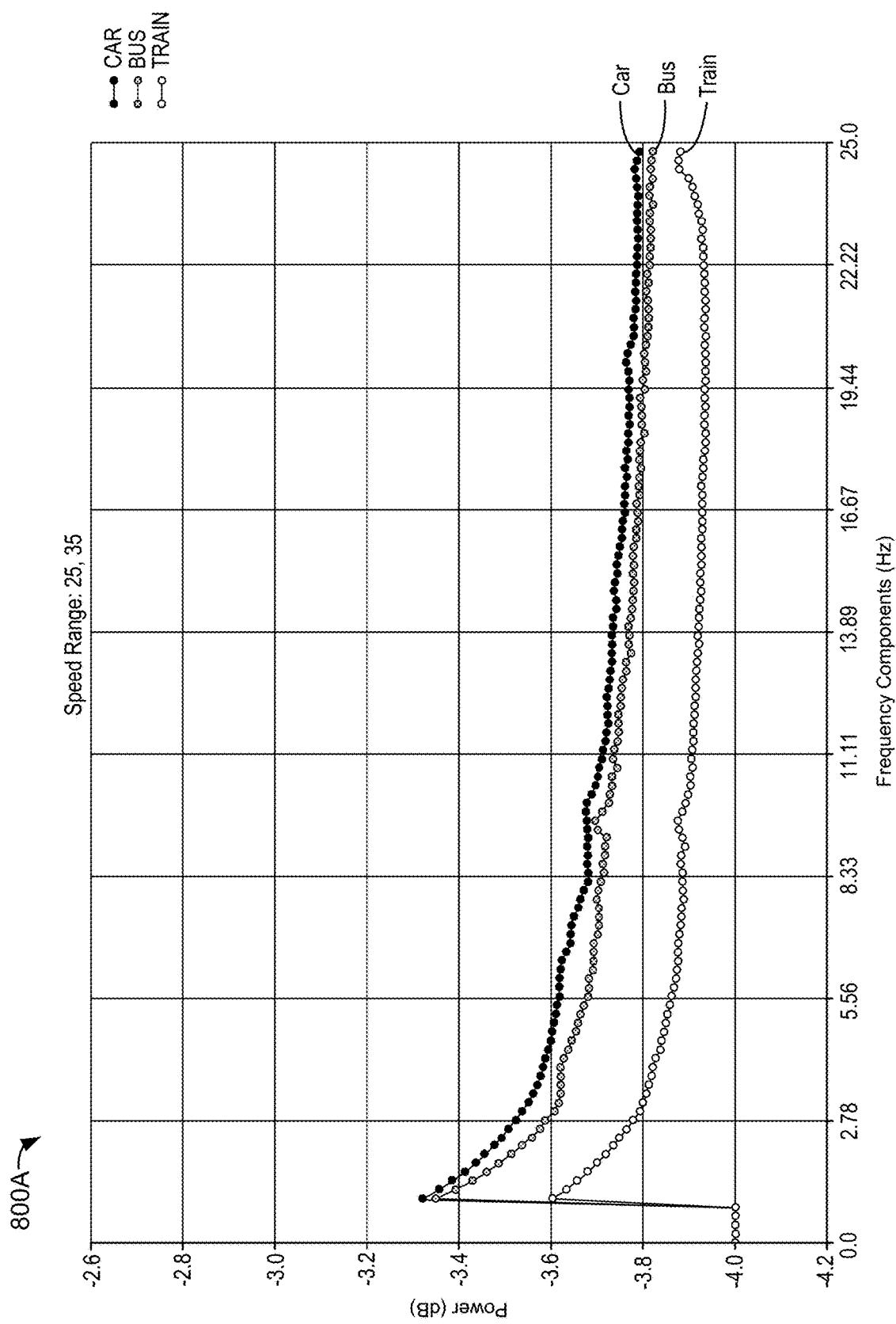
FIG. 8A is a plot of power versus frequency components at a speed range of 25 to 35 miles per hour for a car, a bus, and a train as measured by a magnetometer of a mobile device according to some embodiments.
Figure 13A:
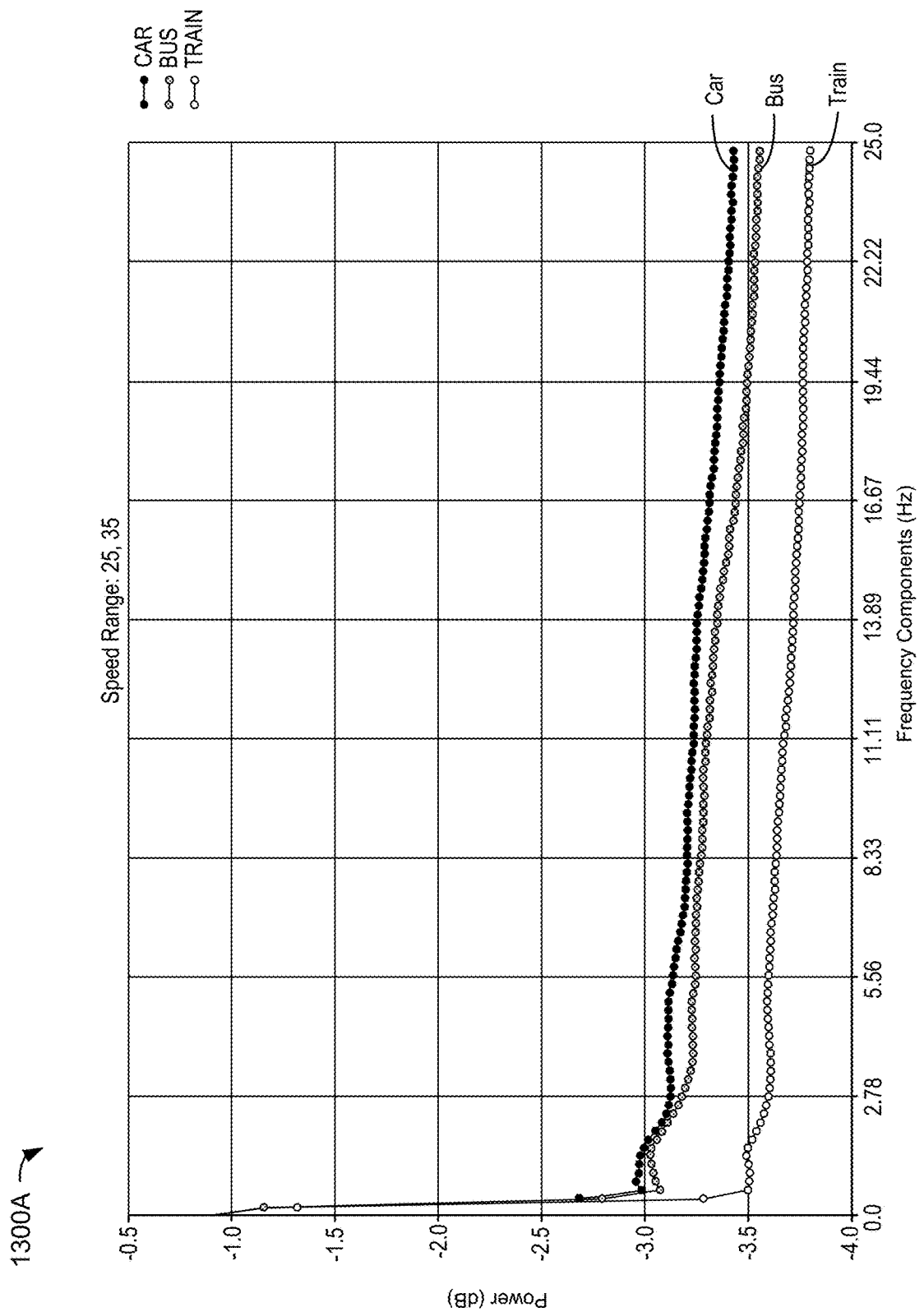
FIG. 13A is a plot of power versus frequency components at a speed range of 25 to 35 miles per hour for a car, a bus, and a train as measured by a magnetometer of a mobile device according to some embodiments.

FIG. 8A is a plot 800A of power versus frequency at a speed range of 25 to 35 miles per hour for a car, a bus, and a train as measured by a magnetometer of a mobile device according to some embodiments. In FIG. 8A, the x-axis represents the Fourier transformed frequency components of the magnetometer signal sampled at 50 Hz. FIG. 8A may be referenced for baseline values for measured speeds of 25 to 35 mph. As shown in FIG. 8A, the power at similar frequencies for a car, a bus, and a train may be different. Thus, by comparing a magnetometer reading at a given frequency component and at a speed of 25 to 35 mph, a difference between the reading and the baseline values may be generated. The transportation mode associated with the lowest difference may be assigned as the type of vehicle associated with the trip. Similarly, FIG. 13A is a plot of power versus frequency at a speed range of 25 to 35 miles per hour for a car, a bus, and a train as measured by a magnetometer of a mobile device according to some embodiments. In FIG. 13A, the x-axis represents the Fourier transformed frequency components of the magnetometer signal sampled at 50 Hz.

Figure 8B:
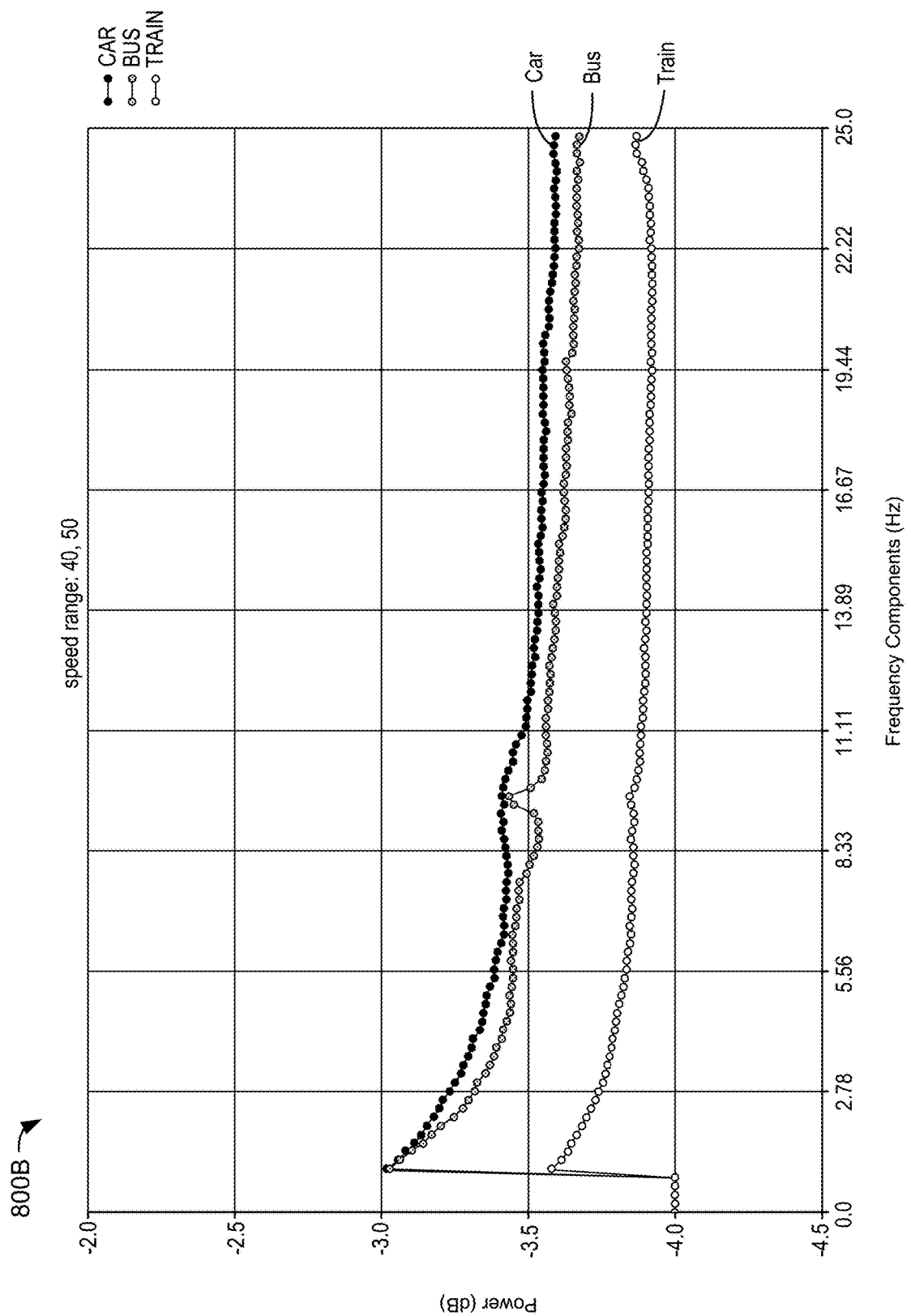
FIG. 8B is a plot of power versus frequency components at a speed range of 40 to 50 miles per hour for a car, a bus, and a train as measured by a magnetometer of a mobile device according to some embodiments.
Figure 13B:
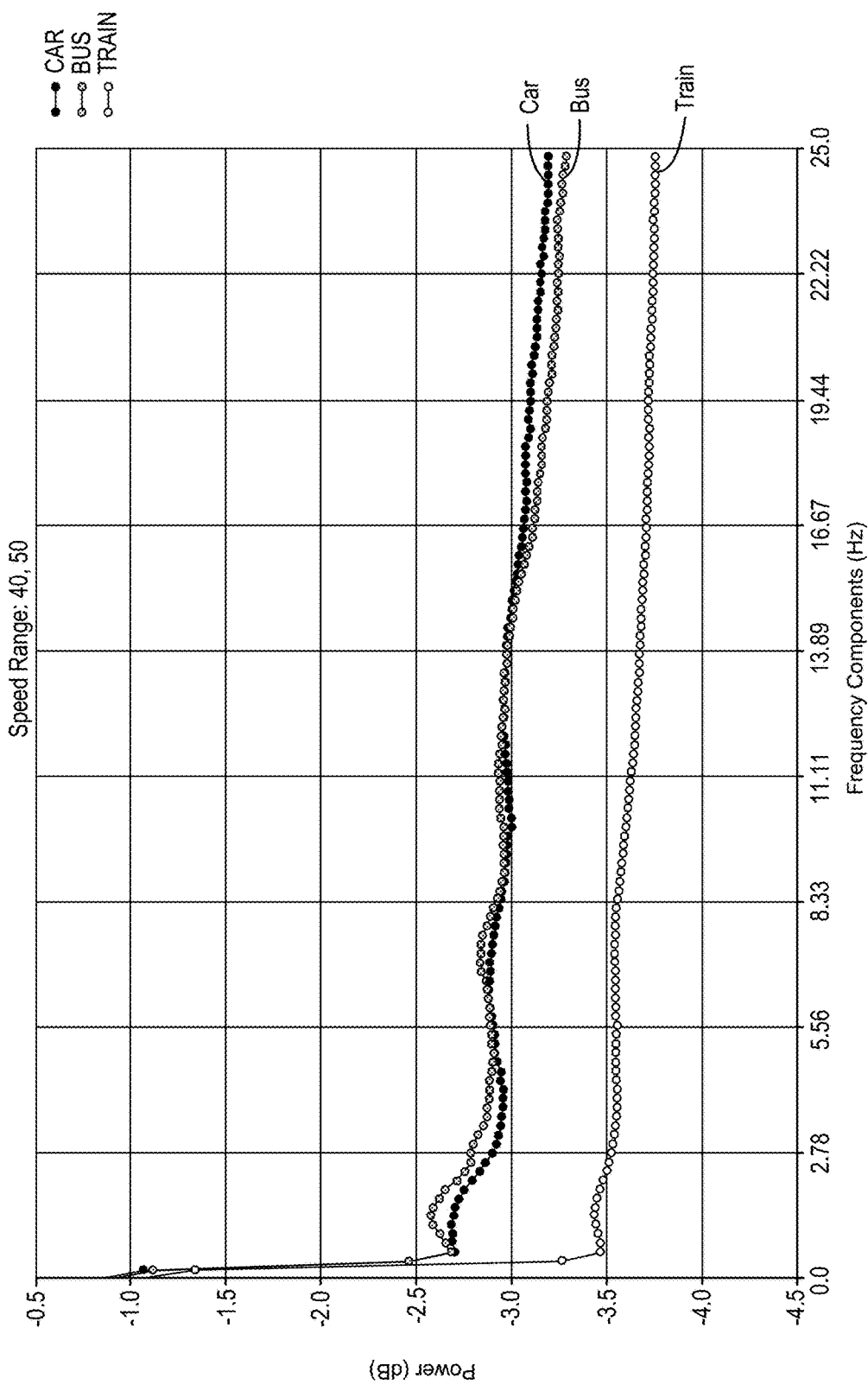
FIG. 13B is a plot of power versus frequency components at a speed range of 40 to 50 miles per hour for a car, a bus, and a train as measured by a magnetometer of a mobile device according to some embodiments.

FIG. 8B is a plot 800B of power versus frequency at a speed range of 40 to 50 miles per hour for a car, a bus, and a train as measured by a magnetometer of a mobile device according to some embodiments. In FIG. 8B, the x-axis represents the Fourier transformed frequency components of the magnetometer signal sampled at 50 Hz. FIG. 8B may be referenced for baseline values for measured speeds of 40 to 50 mph. As shown in FIG. 8B, the power at similar frequencies for a car, a bus, and a train may be different. Thus, by comparing a magnetometer reading at a given frequency component and at a speed of 40 to 50 mph, a difference between the reading and the baseline values may be generated. The transportation mode associated with the lowest difference may be assigned as the type of vehicle associated with the trip. Similarly, FIG. 13B is a plot of power versus frequency at a speed range of 40 to 50 miles per hour for a car, a bus, and a train as measured by a magnetometer of a mobile device according to some embodiments. In FIG. 13B, the x-axis represents the Fourier transformed frequency components of the magnetometer signal sampled at 50 Hz.

Figure 8C:
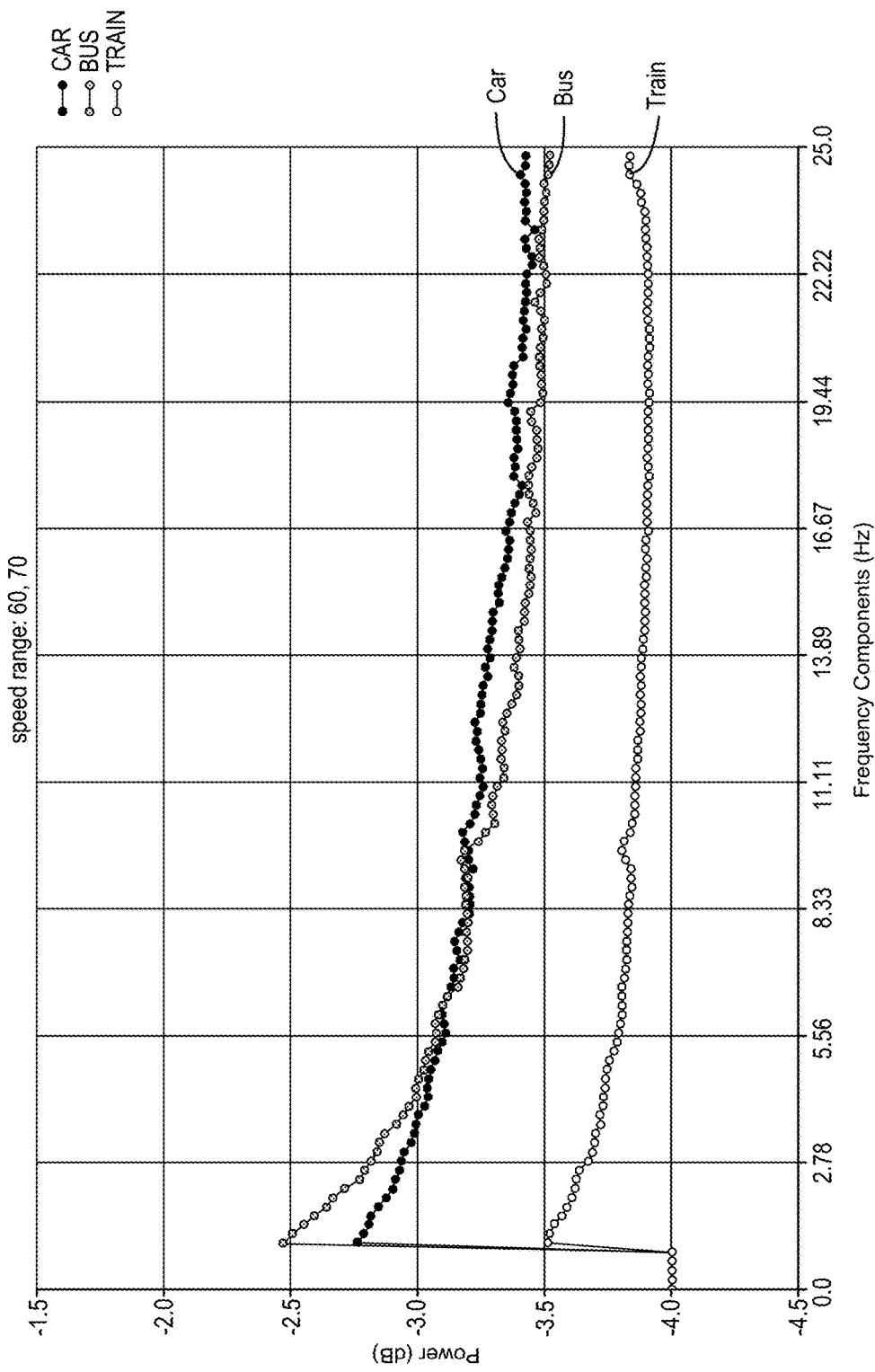
FIG. 8C is a plot of power versus frequency components at a speed range of 60 to 70 miles per hour for a car, a bus, and a train as measured by a magnetometer of a mobile device according to some embodiments.
Figure 13C:
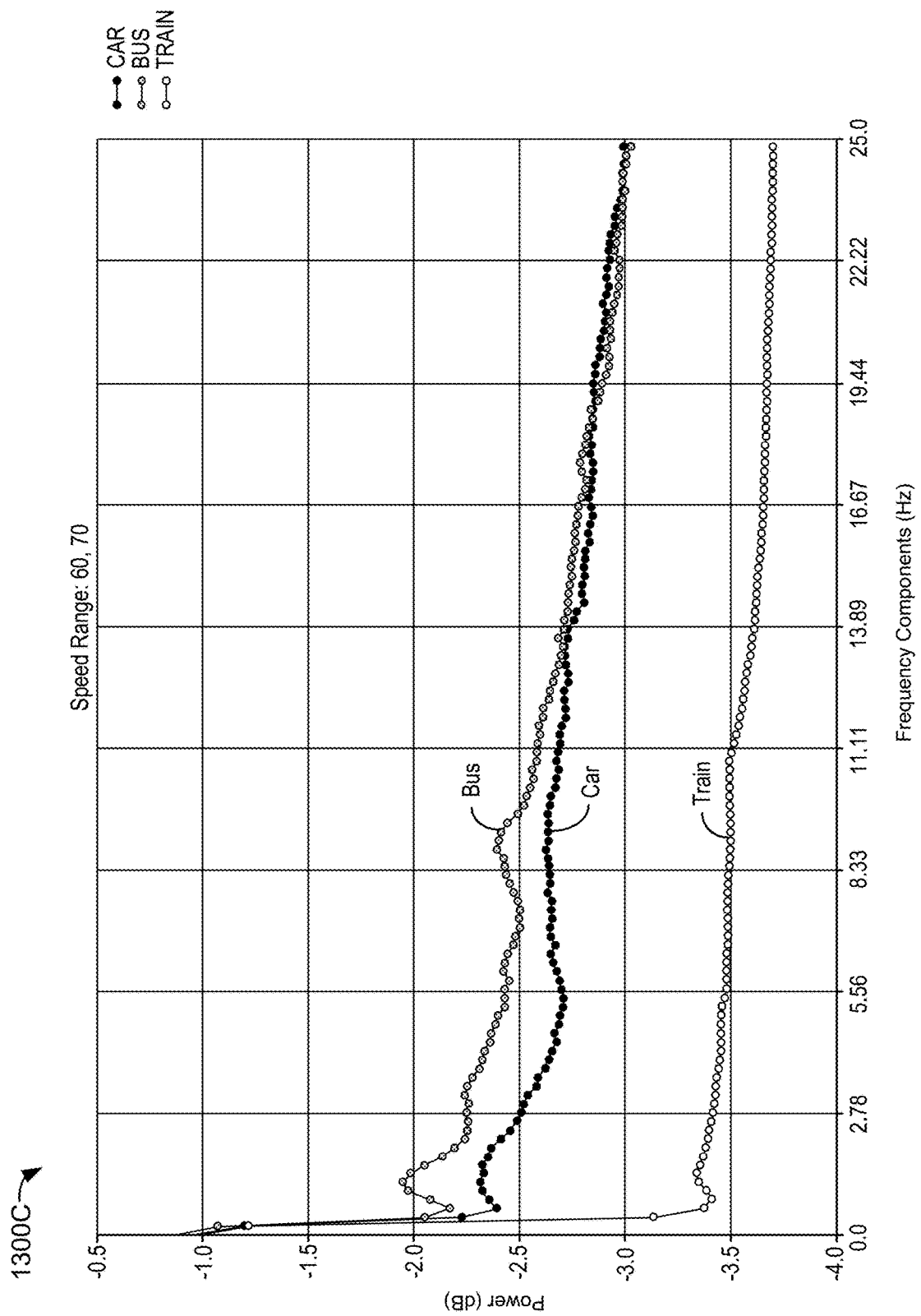
FIG. 13C is a plot of power versus frequency components at a speed range of 60 to 70 miles per hour for a car, a bus, and a train as measured by a magnetometer of a mobile device according to some embodiments.

FIG. 8C is a plot 800C of power versus frequency at a speed range of 60 to 70 miles per hour for a car, a bus, and a train as measured by a magnetometer of a mobile device according to some embodiments. In FIG. 8C, the x-axis represents the Fourier transformed frequency components of the magnetometer signal sampled at 50 Hz. FIG. 8C may be referenced for baseline values for measured speeds of 60 to 70 mph. As shown in FIG. 8C, the power at similar frequencies for a car, a bus, and a train may be different. Thus, by comparing a magnetometer reading at a given frequency component and at a speed of 60 to 70 mph, a difference between the reading and the baseline values may be generated. The transportation mode associated with the lowest difference may be assigned as the type of vehicle associated with the trip. Similarly, FIG. 13C is a plot of power versus frequency at a speed range of 60 to 70 miles per hour for a car, a bus, and a train as measured by a magnetometer of a mobile device according to some embodiments. In FIG. 13C, the x-axis represents the Fourier transformed frequency components of the magnetometer signal sampled at 50 Hz.

Figure 9:
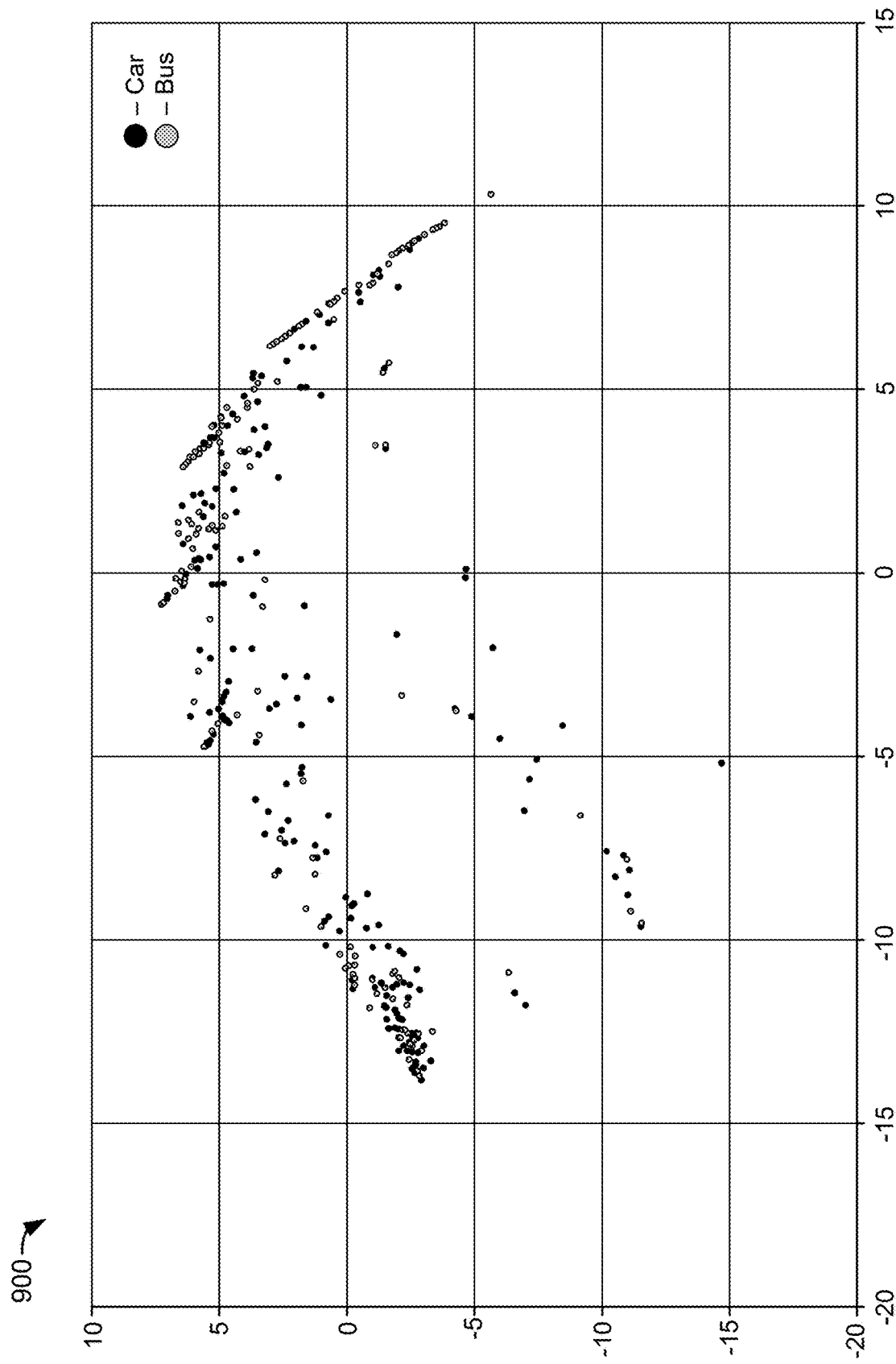
FIG. 9 is a plot illustrating principle component analysis (PCA) of features extracted from car and bus trips according to some embodiments.

FIG. 9 is a plot 900 illustrating principle component analysis (PCA) of features extracted from car and bus trips according to some embodiments. FIG. 9 further illustrates differences between GPS speed groups for different vehicles can be seen when the spectral power features are projected to a lower dimensional space.

Figure 10:
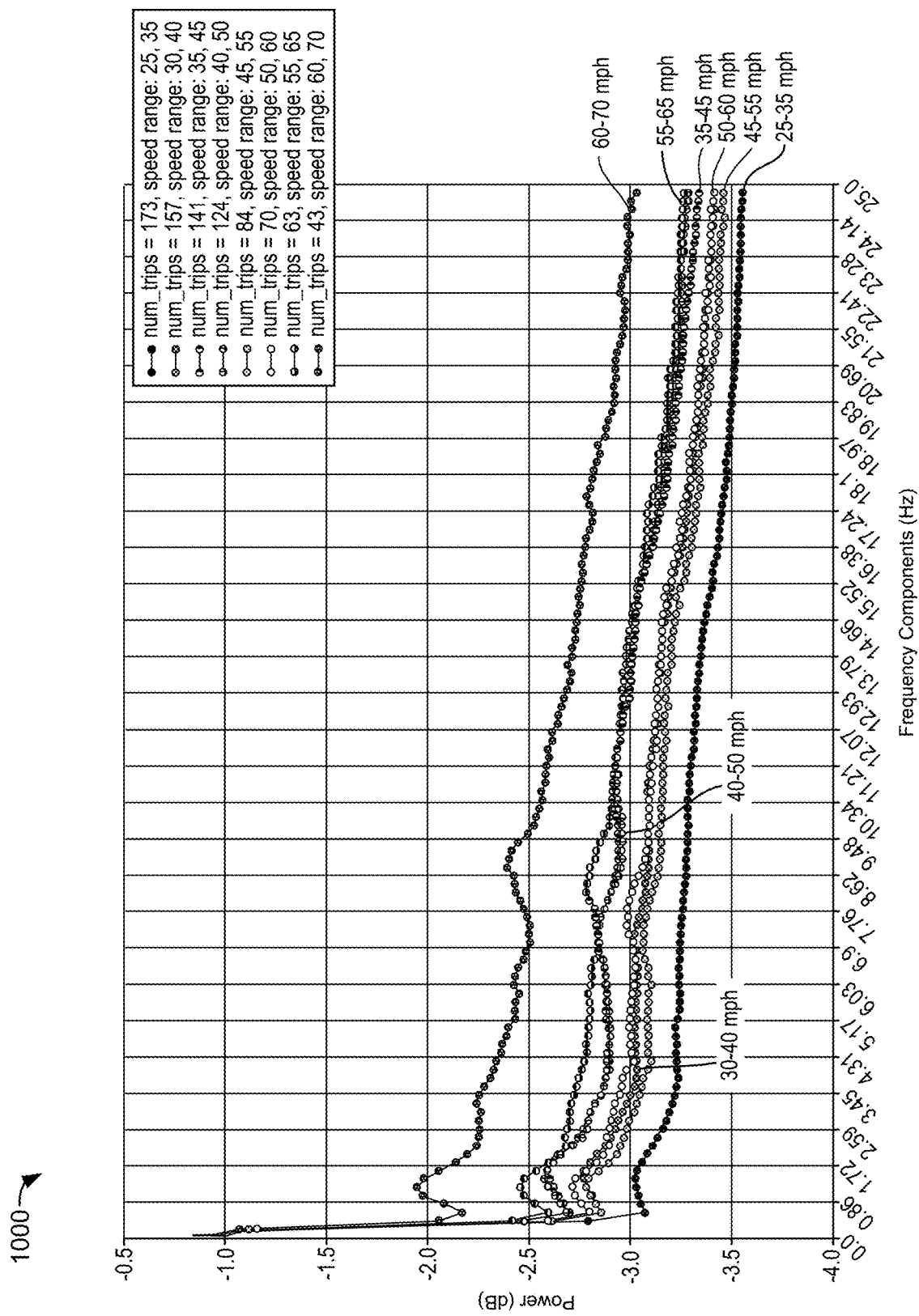
FIG. 10 is a plot of acceleration versus frequency components for a bus at various speeds as measured by an accelerometer of a mobile device according to some embodiments.
Figure 11:
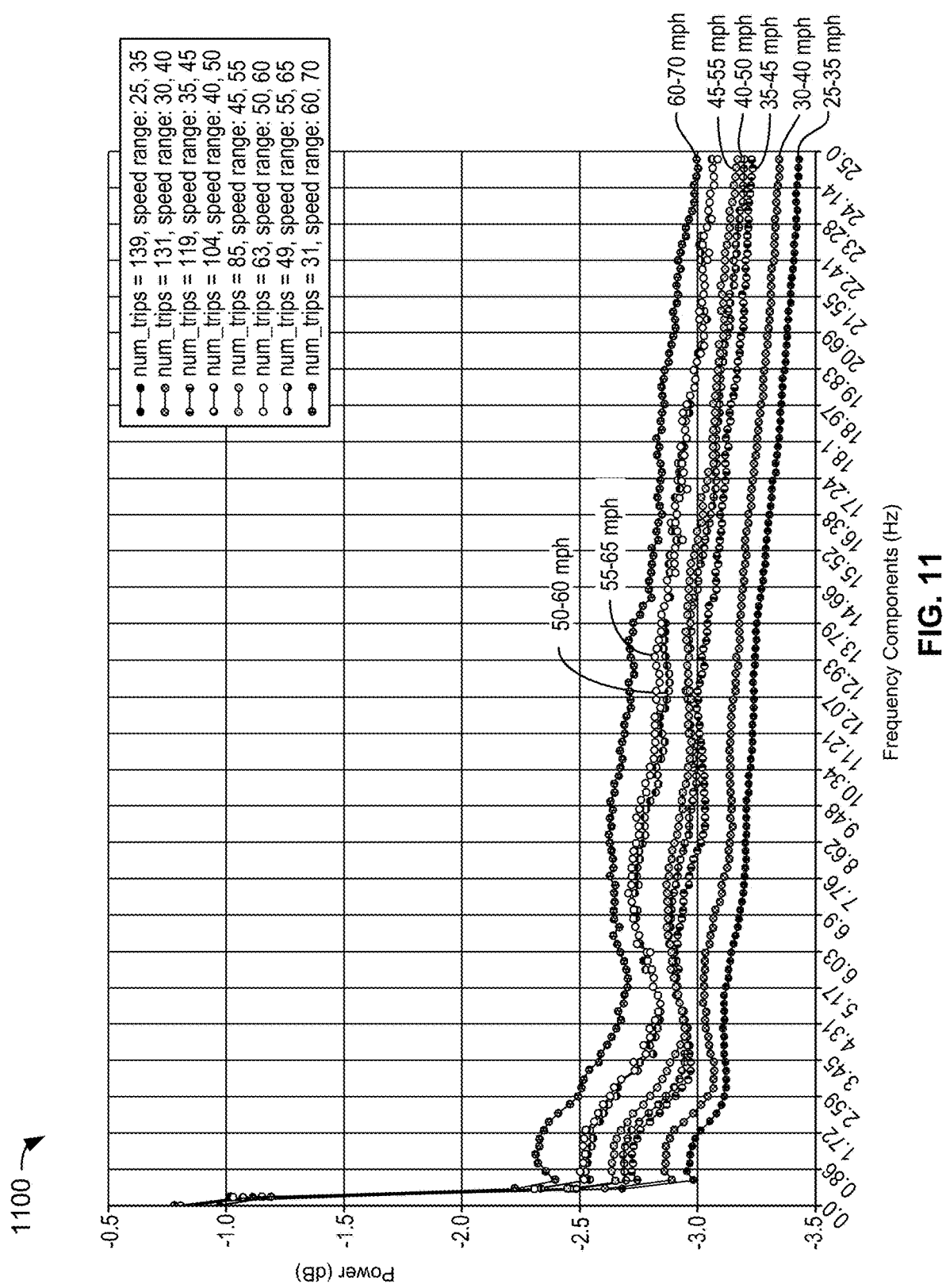
FIG. 11 is a plot of acceleration versus frequency components for a car at various speeds as measured by an accelerometer of a mobile device according to some embodiments.
Figure 12:
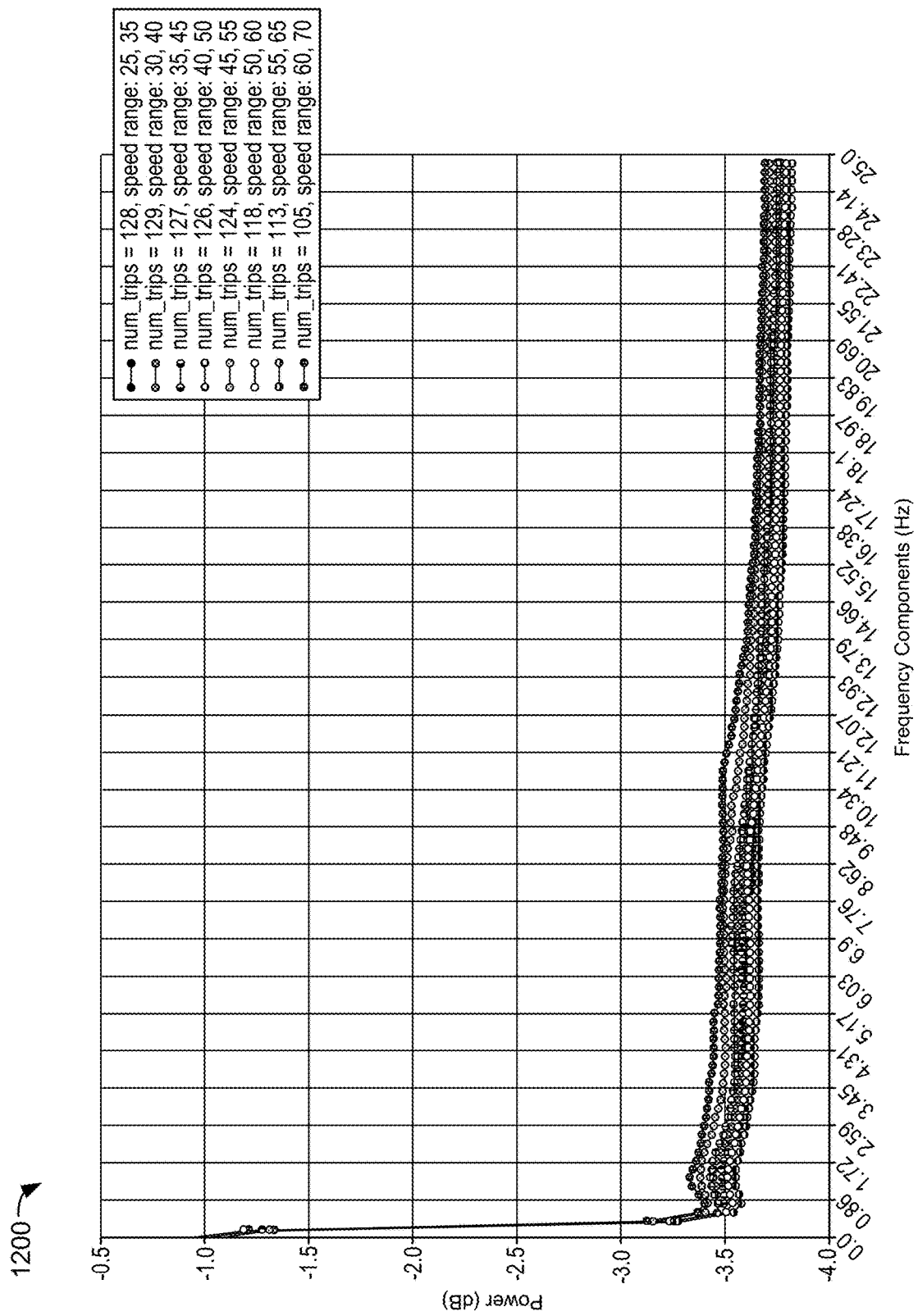
FIG. 12 is a plot of acceleration versus frequency components for a train at various speeds as measured by an accelerometer of a mobile device according to some embodiments.

FIG. 10 is a plot 1000 of acceleration versus frequency for a bus at various speeds as measured by an accelerometer of a mobile device according to some embodiments. FIG. 11 is a plot 1100 of acceleration versus frequency for a car at various speeds as measured by an accelerometer of a mobile device according to some embodiments. FIG. 12 is a plot 1200 of acceleration versus frequency for a train at various speeds as measured by an accelerometer of a mobile device according to some embodiments. In FIGS. 10-12, the x-axis represents the Fourier transformed frequency components of the accelerometer signal sampled at 50 Hz. As shown, acceleration data may be similar across different modes of transportation.

As illustrated by FIGS. 10-12, while differences exist in the accelerometer spectral features for the three transit modes (i.e., bus, car, and train), the differences may not be as significant as the differences seen in magnetometer data. However, using both magnetometer and accelerometer spectral features may result in more accurate classification of transit modes. For example, it may be possible to build an algorithm for transit mode classification that consumes magnetometer and accelerometer spectral features. The combination of magnetometer and accelerometer spectral features may provide more accurate classification than spectral features obtained from a magnetometer or an accelerometer as standalone sensors.

As noted, the computer-readable medium may include transient media, such as a wireless broadcast or wired network transmission, or storage media (that is, non-transitory storage media), such as a hard disk, flash drive, compact disc, digital video disc, Blu-ray disc, or other computer-readable media. The computer-readable medium may be understood to include one or more computer-readable media of various forms, in various examples.

In the foregoing description, aspects of the application are described with reference to specific embodiments thereof, but those skilled in the art will recognize that the invention is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Where components are described as performing or being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the embodiments disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software modules or hardware modules configured for encoding and decoding, or incorporated in a combined video encoder-decoder (CODEC).

The examples and embodiments described herein are for illustrative purposes only. Various modifications or changes in light thereof will be apparent to persons skilled in the art. These are to be included within the spirit and purview of this application, and the scope of the appended claims, which follow.

What is claimed is:

1. A method comprising:
    obtaining, by a processor, accelerometer data from an accelerometer of a mobile device during a trip;
    obtaining, by the processor, speed data from one or more sensors of the mobile device during the trip;
    correlating, by the processor, the accelerometer data with the speed data;
    separating, by the processor, the accelerometer data into one or more groupings based on the correlated accelerometer data;
    performing, by the processor, a spectral analysis on magnitudes of the accelerometer data for each of the one or more groupings to obtain a plurality of frequency components;
    determining, by the processor, an energy for each of the plurality of frequency components based on the spectral analysis;
    determining, by the processor, a difference between the energy and a baseline energy of a plurality of baseline energies for each of the plurality of frequency components, wherein each baseline energy of the plurality of baseline energies is associated with at least one of: a transportation mode of a plurality of transportation modes, or a frequency component of the plurality of frequency components for a transportation mode; and
    determining, by the processor, a transportation mode used for the trip based on one or more of the differences for one or more frequency components of the plurality of frequency components.

2. The method of claim 1, wherein the transportation mode is a car.

3. The method of claim 2, further comprising:
    operating the one or more sensors at a first sampling frequency before determining the transportation mode; and
    operating the one or more sensors at a second sampling frequency after determining the transportation mode, wherein the second sampling frequency is higher than the first sampling frequency.

4. The method of claim 1, wherein the transportation mode is one of a bus, train, or subway.

5. The method of claim 4, further comprising:
    operating the one or more sensors at a first sampling frequency before determining the transportation mode; and
    operating the one or more sensors at a second sampling frequency after determining the transportation mode, wherein the second sampling frequency is lower than the first sampling frequency.

6. The method of claim 4, further comprising:
    operating the one or more sensors at a first sampling frequency before determining the transportation mode; and
    disabling the one or more sensors after determining the transportation mode.

7. A system, comprising:
    one or more sensors configured to gather speed data;
    an accelerometer; and
    a processor configured to perform operations including:
        obtaining accelerometer data during a trip;
        obtaining speed data from the one or more sensors during the trip;
        correlating the accelerometer data with the speed data;
        separating the accelerometer data into one or more groupings based on the speed data;
        performing a spectral analysis on magnitudes of the accelerometer data for each of the one or more groupings to obtain a plurality of frequency components;
        determining an energy for each of the plurality of frequency components based on the spectral analysis;
        determining a difference between the energy and a baseline energy of a plurality of baseline energies for each of the plurality of frequency components, wherein each baseline energy of the plurality of baseline energies is associated with at least one of: a transportation mode of a plurality of transportation modes, or a frequency component of the plurality of frequency components for a transportation mode; and
        determining a transportation mode used for the trip based on one or more of the differences for one or more frequency components of the plurality of frequency components.

8. The system of claim 7, wherein the one or more sensors and the accelerometer are part of a mobile device; and wherein the processor is separate from the mobile device.

9. The system of claim 7, wherein the one or more sensors, the accelerometer, and the processor are part of a mobile device.

10. The system of claim 7, wherein the transportation mode is a car.

11. The system claim 10, wherein the processor is further configured to perform operations further including:
operating the one or more sensors at a first sampling frequency before determining the transportation mode; and
operating the one or more sensors at a second sampling frequency after determining the transportation mode, wherein the second sampling frequency is higher than the first sampling frequency.

12. The system of claim 7, wherein the transportation mode is one of a bus, a train, or a subway.

13. The system of claim 12, wherein the processor is further configured to perform operations including:
operating the one or more sensors at a first sampling frequency before determining the transportation mode; and
operating the one or more sensors at a second sampling frequency after determining the transportation mode, wherein the second sampling frequency is lower than the first sampling frequency.

14. The system of claim 12, wherein the processor is further configured to perform operations including:
operating the one or more sensors at a first sampling frequency before determining the transportation mode; and
disabling the one or more sensors after determining the transportation mode.

15. A non-transitory computer readable medium comprising instructions that, when executed by one or more processors, cause the one or more processors to perform operations including:
obtaining accelerometer data from an accelerometer in a mobile device during a trip;
obtaining speed data from one or more sensors of the mobile device during the trip;
correlating the accelerometer data with the speed data;
separating the accelerometer data into one or more groupings based on the speed data;
performing a spectral analysis on magnitudes of the accelerometer data for each of the one or more groupings to obtain a set of frequency components;
determining, based on the spectral analysis, an energy for each of the set of frequency components;
determining a difference between the energy and a baseline energy of a plurality of baseline energies for each of the set of frequency components, wherein each baseline energy of the plurality of base energies is associated with at least one of: a transportation mode of a plurality of transportation modes, or a frequency component of a plurality of frequency components for a transportation mode; and
determining a transportation mode used for the trip based on one or more of the differences for one or more frequency components of the plurality of frequency components.

16. The non-transitory computer readable medium as defined in claim 15, further comprising instructions that, when executed by the one or more processors, causes the one or more processors to perform operations including determining the transportation mode used for the trip is a car.

17. The non-transitory computer readable medium as defined in claim 16, further comprising instructions that, when executed by the one or more processors, causes the one or more processors to perform operations including:
operating the one or more sensors at a first sampling frequency before determining the transportation mode; and
operating the one or more sensors at a second sampling frequency after determining the transportation mode, wherein the second sampling frequency is higher than the first sampling frequency.

18. The non-transitory computer readable medium as defined in claim 15, further comprising instructions that, when executed by the one or more processors, causes the one or more processors to perform operations including determining the transportation mode used for the trip is one of one of a bus, a train, or a subway.

19. The non-transitory computer readable medium as defined in claim 18, further comprising instructions that, when executed by the one or more processors, causes the one or more processors to perform operations including:
operating the one or more sensors at a first sampling frequency before determining the transportation mode; and
operating the one or more sensors at a second sampling frequency after determining the transportation mode, wherein the second sampling frequency is lower than the first sampling frequency.

20. The non-transitory computer readable medium as defined in claim 18, further comprising instructions that, when executed by the one or more processors, causes the one or more processors to perform operations including:
operating the one or more sensors at a first sampling frequency before determining the transportation mode; and
disabling the one or more sensors after determining the transportation mode.

* * * * *